US011910562B2

(12) United States Patent
Gao

(10) Patent No.: US 11,910,562 B2
(45) Date of Patent: Feb. 20, 2024

(54) LOCALIZED THERMAL ACCELERATOR IN AN IMMERSION ENVIRONMENT

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/557,672

(22) Filed: Dec. 21, 2021

(65) Prior Publication Data
US 2023/0200005 A1    Jun. 22, 2023

(51) Int. Cl.
*H05K 7/20* (2006.01)
(52) U.S. Cl.
CPC ..... *H05K 7/20236* (2013.01); *H05K 7/20263* (2013.01); *H05K 7/20327* (2013.01); *H05K 7/20781* (2013.01)
(58) Field of Classification Search
CPC ........... H05K 7/20236; H05K 7/20263; H05K 7/20327; H05K 7/20781
See application file for complete search history.

(56) References Cited

U.S. PATENT DOCUMENTS

| | | | |
|---|---|---|---|
| 2021/0185850 A1* | 6/2021 | Kulkarni | H05K 7/20327 |
| 2022/0004234 A1* | 1/2022 | Zong | F28D 15/0275 |
| 2022/0322575 A1* | 10/2022 | Hnayno | H05K 7/20781 |

* cited by examiner

*Primary Examiner* — Mukundbhai G Patel
(74) *Attorney, Agent, or Firm* — WOMBLE BOND DICKINSON (US) LLP

(57) ABSTRACT

A cooling plate includes a fluid inlet port, a cooling enclosure, and an inlet channel coupled between the fluid inlet port and the cooling enclosure to channel a two-phase fluid entering from the inlet port to the cooling enclosure. The cooling enclosure includes a number of heat spreading structures coupled to an inner surface of the cooling enclosure to form spacings, where the two-phase fluid in contact with the heat spreading structures causes portions of the two-phase fluid to change into a vapor phase. The cooling plate includes an extended vapor channel coupled to the cooling enclosure to collect the two-phase fluid in vapor phase. The cooling plate includes a vapor outlet port coupled to the extended vapor channel for the two-phase fluid in vapor phase to exit the vapor outlet port, where the cooling plate is submersible in an immersion tank containing a single-phase immersion fluid.

20 Claims, 5 Drawing Sheets

LOCALIZED THERMAL ACCELERATOR IN AN IMMERSION ENVIRONMENT

FIELD OF THE INVENTION

Embodiments of the present invention relate generally to server and data center cooling. More particularly, embodiments of the invention relate to localized thermal accelerator in an immersion environment.

BACKGROUND

Thermal management for a data center that includes several active electronic racks is critical to ensure proper performance of servers and/or other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit.

Recently, data centers have been deploying high-power-density electronic racks, where a large quantity of high-density chips are packaged closer together to provide more computing power. Cooling these high-density racks by maintaining a proper thermal environment may be an issue with existing cooling systems, such as a computer room air conditioning (CRAC) unit. For instance, although the CRAC unit may maintain the thermal environment with more conventional (or lower-density) racks, the unit may be unable to effectively cool high-power density racks because they may generate heat load at a higher rate due to the higher density electronics. Or significant cost may be needed for upgrading a CRAC system to satisfy a cooling requirement of a high density deployment. Another challenge for air cooling high density racks is moving a large amount of airflow sufficient to cool the racks. Since heat removal capacity of fluid is much larger than heat removal capacity of air, thus it is more economical to move cooling fluid for cooling. Therefore, designing the cooling fluid closer to the IT, indirectly or directly in contact with electronics are an effective mean.

Immersion cooling, which involves at least partially submerging electronics in a non-conductive dielectric solution, is a feasible solution for high-density electronics. Existing solutions for immersion cooling only considers fluid recirculation for an electronic rack without local cooling acceleration. Heterogeneous electronic components that can give rise to predictable hot spots with immersion cooling.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
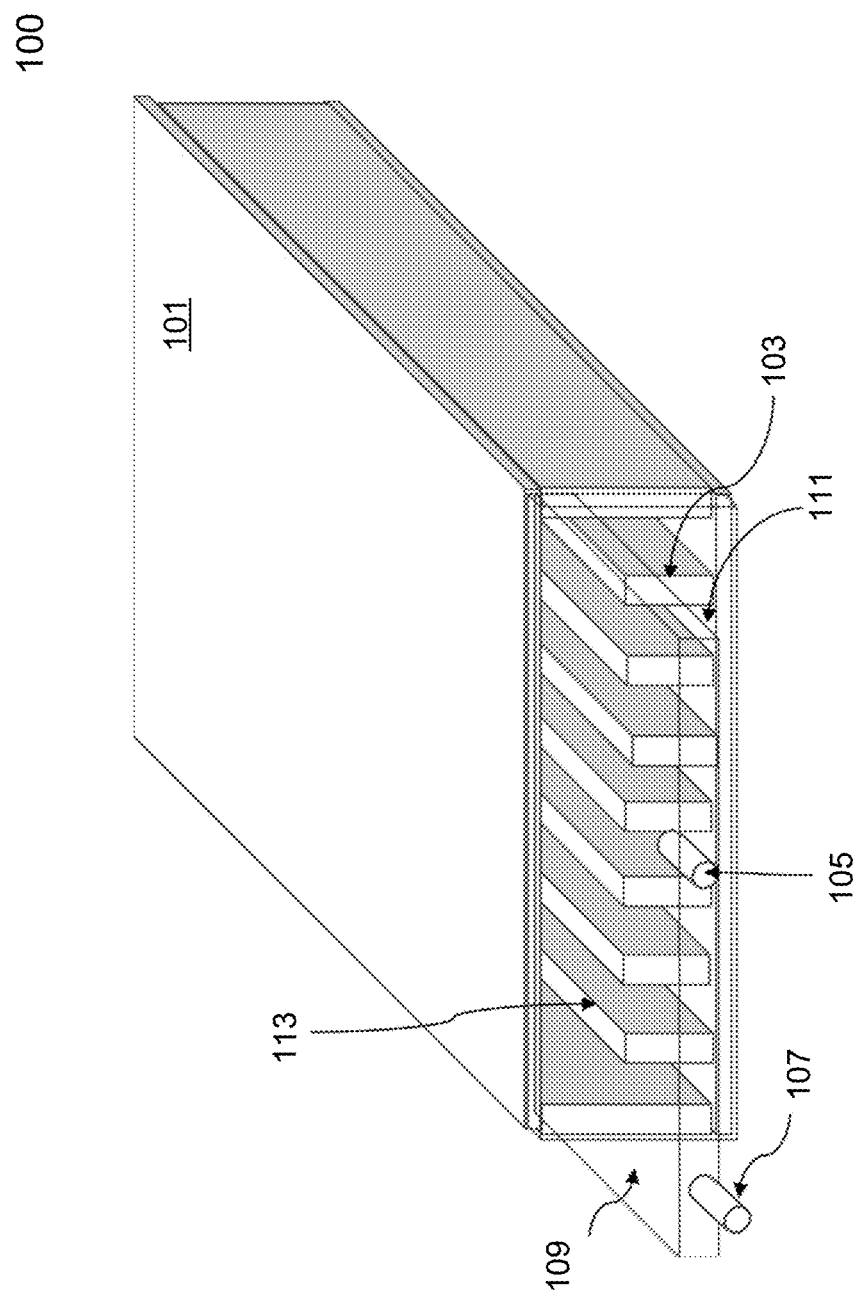
FIG. 1 is a block diagram illustrating an immersion cooling plate according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Existing liquid cooling solutions are mainly developed using either a single-phase fluid cooling solution or a two-phase fluid cooling solution. Embodiments of the current disclosure provides an immersion configuration for server electronics using a mix of single-phase and two-phase fluids. A single-phase fluid can be used for immersion cooling and a two-phase fluid can be used for local cooling acceleration to alleviate hot spots. Note that two-phase fluid refers to a liquid coolant where cooling is provided to electronics by undergoing a phase change from liquid phase to vapor phase when the electronics is in thermal contact with the liquid coolant during cooling. Whereas, single-phase fluid refers to a liquid coolant that is selected to provide cooling to electronics by passing the single-phase fluid through thermal conductor of the electronics, e.g., thermal conduction, for cooling without undergoing a phase change.

According to a first aspect, a cooling plate includes a fluid inlet port, a cooling enclosure, and an inlet channel coupled between the fluid inlet port and the cooling enclosure to channel a two-phase fluid entering from the inlet port to the cooling enclosure. The cooling enclosure includes a number of heat spreading structures coupled to an inner surface of the cooling enclosure to form a number of spacings in between the heat spreading structures, where the spacings increase a surface contact area of the two-phase fluid containable within the cooling enclosure with the heat spreading structures to distribute heat from the heat spreading structures to the two-phase fluid to cause portions of the two-phase fluid to change into a vapor phase. The cooling plate includes an extended vapor channel coupled to the cooling enclosure to collect the two-phase fluid in vapor phase. The cooling plate includes a vapor outlet port coupled to the extended vapor channel for the two-phase fluid in vapor phase to exit the cooling plate, where the cooling plate is submersible in an immersion tank containing a single-phase immersion fluid. The two-phase fluid provides localized cooling to solve hot spots in immersion cooling. The localized cooling further allows increases in power and density of the immersion electronics.

In one embodiment, the cooling enclosure or the heat spreading structures include copper or aluminum metal. In one embodiment, the spacings in between the heat spreading structures form fluid channels along a length of the heat spreading structures.

In one embodiment, the cooling enclosure has an internal region to contain the two-phase liquid and the cooling enclosure separates the single-phase liquid surrounding the cooling enclosure from the two-phase liquid containable within.

In one embodiment, the fluid inlet port is connected to a two-phase liquid supply and the vapor outlet port is connected to a vapor return of an immersion tank.

Figure 2:
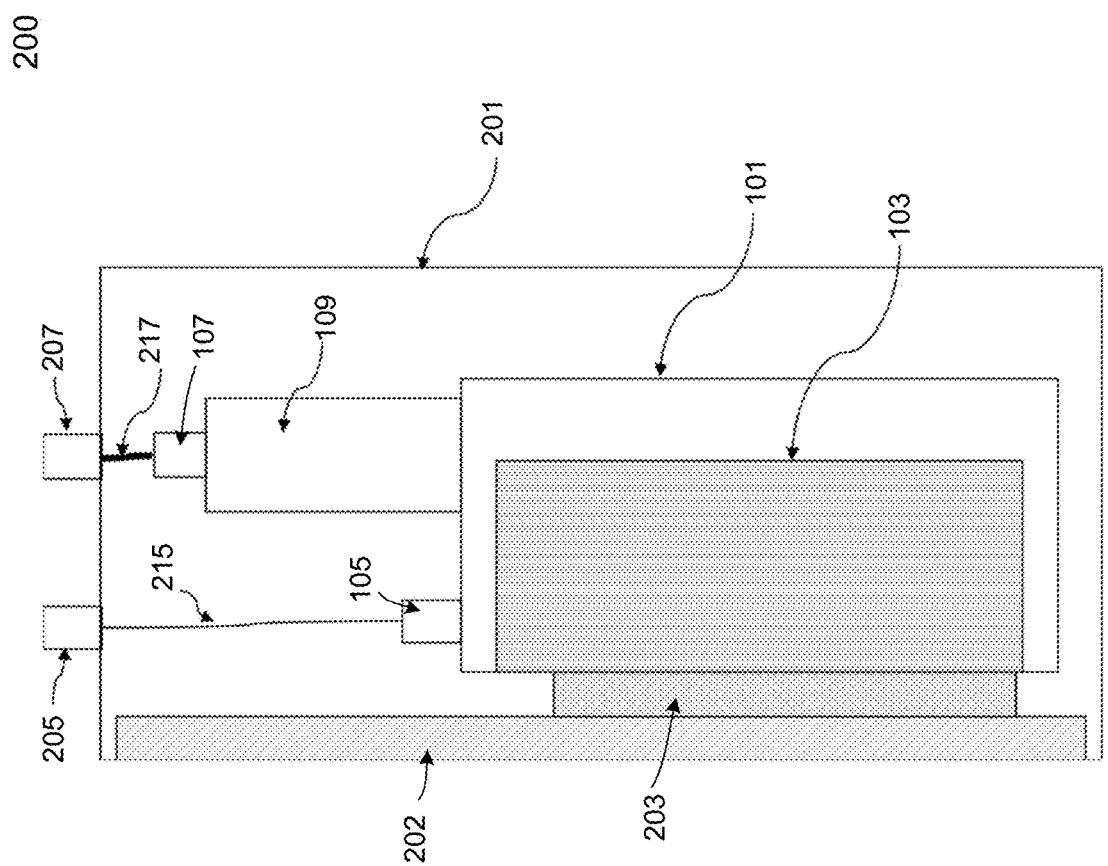
FIG. 2 is a block diagram illustrating an immersion server configuration with local cooling acceleration according to one embodiment.
Figure 3:
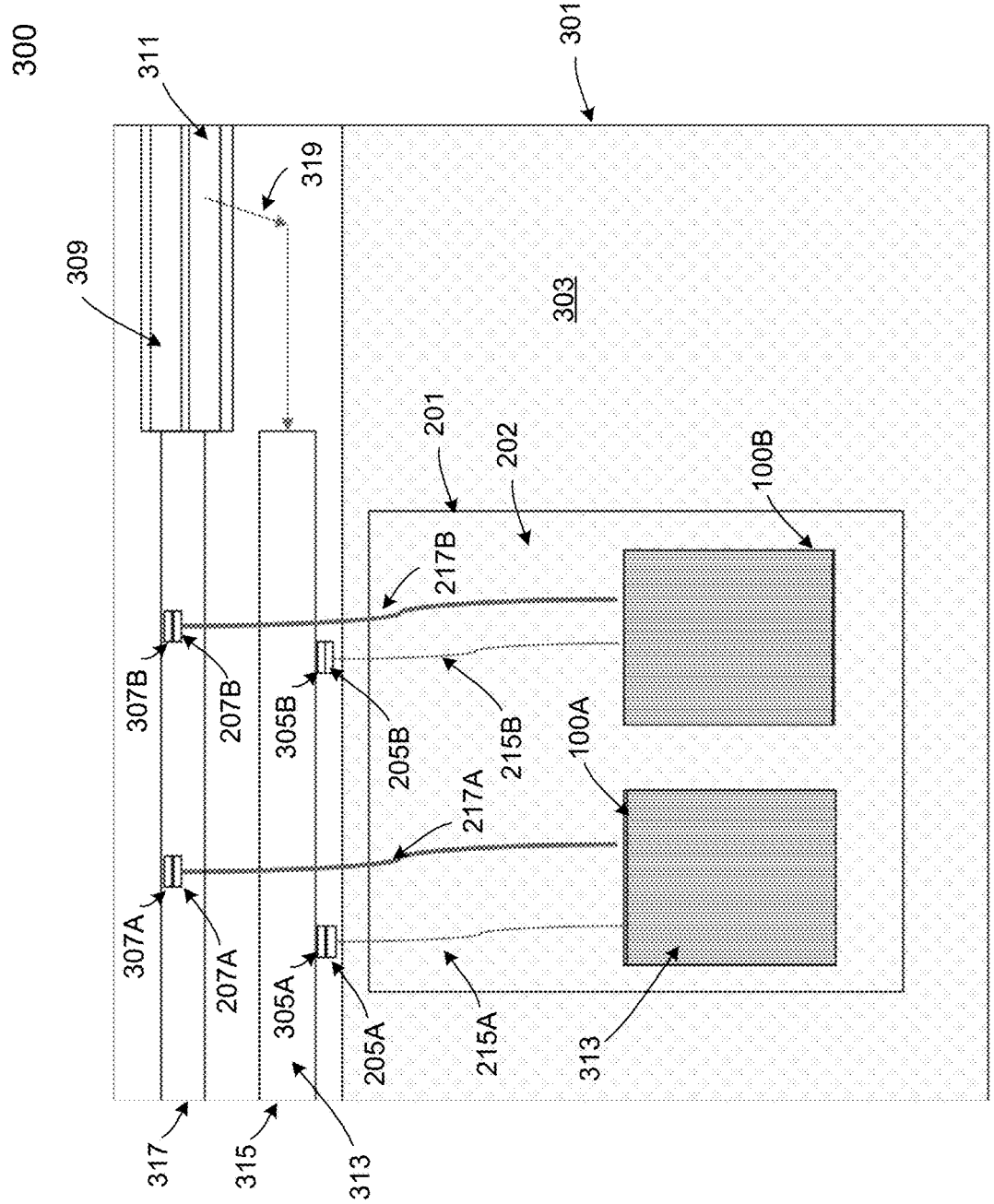
FIG. 3 is a block diagram illustrating an immersion configuration utilizing single-phase with two-phase fluids for local cooling acceleration according to one embodiment.

For example, in one embodiment, referring to FIGS. 1-2, ports 107 and 105 can be fixed to cooling plate 100. In this design, an additional set of loop lines 215-217 having ends packaged with ports/connectors 205-207 are required to connect to external sources, where the loop lines are connected to ports 105 and 107. In another embodiment, ports 107 and 105 can be assembled to enclosure 101 through flexible hoses and ports 105 and 107 are extendible by extending the flexible hoses as shown in FIG. 3.

In one embodiment, the extended vapor channel includes an intermediate holding region for the two-phase fluid in vapor phase prior to transporting the two-phase fluid in vapor phase to vapor outlet port.

In one embodiment, the extended vapor channel is submersible within the single-phase fluid to exchange heat between the single-phase fluid and the two-phase fluid in vapor phase containable within the extended vapor channel to condense portions of the two-phase fluid in vapor phase to liquid phase, wherein the two-phase fluid in liquid phase returns directly to an internal region of the cooling enclosure.

In one embodiment, a fluid flow of the single-phase immersion fluid is separate from a fluid flow of the two-phase fluid within an internal region of the cooling enclosure. In one embodiment, the heat spreading structures are assembled or directly machined on the cooling enclosure. In one embodiment, a surface of the cooling enclosure interfaces to a chip or any other electronics packaged on a server to provide two-phase thermal cooling to the chip.

In one embodiment, the vapor outlet port and fluid input port are situated on a same side of the cooling enclosure or different sides of the cooling enclosure. If the vapor outlet port and fluid input port are situated on a same side, the cooling plate can be place having the ports facing the top of the immersion tank. In this case, two-phase cooling fluid can enter cooling plate through fluid input port via gravity. When the two-phase cooling fluid evaporates, the vapor can rise from the cooling plate via a change in pressure within an internal region of the cooling plate, efficiently in a passive manner.

According to a second aspect, an immersion tank for electronics includes an immersion enclosure and a distribution manifold coupled to the immersion enclosure. The distribution manifold includes one or more fluid supply connectors, one or more vapor return connectors, and one or more cooling plates situated below the one or more fluid supply and the vapor return connectors. A cooling plate includes a fluid inlet port, a cooling enclosure, and an inlet channel coupled between the fluid inlet port and the cooling enclosure to channel a two-phase fluid entering from the inlet port to the cooling enclosure. The cooling enclosure includes a number of heat spreading structures coupled to an inner surface of the cooling enclosure to form a number of spacings in between the heat spreading structures, where the spacings increase a surface contact area of the two-phase fluid containable within the cooling enclosure with the heat spreading structures to distribute heat from the heat spreading structures to the two-phase fluid to cause portions of the two-phase fluid to change into a vapor phase. The cooling plate includes an extended vapor channel coupled to the cooling enclosure to collect the two-phase fluid in vapor phase. The cooling plate includes a vapor outlet port coupled to the extended vapor channel for the two-phase fluid in vapor phase to exit the vapor outlet port, where the cooling plate is submersible in an immersion tank containing a single-phase immersion fluid. The two-phase fluid provides localized cooling to solve hot spots in single phase immersion cooling. The localized cooling further allows increases in power and density of the immersion electronics.

According to a third aspect, an immersion server configuration includes a server enclosure having server electronics housed within, at least one server inlet port, at least one server outlet port, at least one inlet extensible line coupled to the at least one server inlet port, at least one outlet extensible lines coupled to the at least one server outlet port, and at least one cooling plate. The at least one cooling plate includes a fluid inlet port coupled to the at least one inlet extensible line to receive a two-phase fluid from the at least one server inlet port, a cooling enclosure thermally coupled to portions of the server electronics for cooling acceleration, and an inlet channel coupled between the fluid inlet port and the cooling enclosure to channel a two-phase fluid entering from the inlet port to the cooling enclosure. The cooling enclosure includes a number of heat spreading structures coupled to an inner surface of the cooling enclosure to form a number of spacings in between the heat spreading structures, where the spacings increase a surface contact area of the two-phase fluid containable within the cooling enclosure with the heat spreading structures to distribute heat from the heat spreading structures to the two-phase fluid to cause portions of the two-phase fluid to change into a vapor phase, an extended vapor channel coupled to the cooling enclosure to collect the two-phase fluid in vapor phase, and a vapor outlet port coupled between the extended vapor channel and the at least one outlet extensible line to return a two-phase fluid in vapor phase from the extended vapor channel to the at least one server outlet port. The cooling plate is submersible in the immersion tank containing a single-phase immersion fluid.

FIG. 1 is a block diagram illustrating an immersion cooling plate (or cooling plate) 100 according to one embodiment. Cooling plate 100 is designed to be submerged in an immersion fluid and be directly coupled to high power density chips to provide local cooling acceleration to the high power density chips.

In one embodiment, cooling plate 100 includes an enclosure 101 forming an internal region which is designed as an enclosure separating two-phase coolant fluid contained within enclosure 101 and single-phase coolant surrounding enclosure 101. In one embodiment, enclosure 101 includes one or more heat spreading structures (or fins) 103 situated on an inner side of enclosure 101. Fins 103 can increase an inner surface area for a two-phase fluid contained within enclosure 101 to be in thermal contact with enclosure 101 to extend the effective heat transferring area of enclosure 101. When the two-phase coolant is filled within the internal region, heat that is transferred from thermally coupled electronics cause the two-phase coolant fluid to evaporate from a liquid to a vapor. The phase change of the two-phase coolant fluid serves to thermal cool the electronics. In one embodiment, enclosure 101 and/or fins 103 can be made of copper and/or aluminum metals. In one embodiment, fins 103 are assembled or directly machined on enclosure 101.

In one embodiment, cooling plate 100 includes an inlet port 105 and an outlet port 107 situated on a same side of enclosure 101. Inlet port 105 can be connected to a two-phase liquid supply line of an electronic rack to supply a cooling fluid, e.g., two-phase cooling fluid, in cooling plate 100. Outlet port 107 can be connected to a vapor return line of an electronic rack to return a vapor, e.g., the two-phase cooling fluid in vapor phase. In another embodiment, inlet port 105 is situated on a different side of enclosure 101 than outlet port 107. In one embodiment, inlet port 105 and outlet port 107 are fixed to enclosure 101 of cooling plate 101 and additional loop lines with inlet/outlet ports can be coupled to inlet port 105 and outlet port 107 as further shown in FIG. 2. In some embodiments, inlet port 105 and outlet port 107 can be extensible, where inlet port 105 and outlet port 107 are extended to couple to a distribution manifold of an immersion tank as further shown in FIG. 3.

In one embodiment, fins 103 forms flow channels (or spacings) 111 which can be aligned to inlet port 105 to facilitate fluid flow within enclosure 101. In one embodiment, fins 103 can have a height approximately half of a height of the internal region of enclosure 101. In one embodiment, each of flow channels 111 has a height greater than a width of the flow channel. In this case, flow channels have an open top and two-phase coolant fluid/vapor flowing through channels 111 can escape at outlet 113 (open top of flow channels or the area along the tips of fins 103).

In one embodiment, cooling plate 100 includes an extended vapor channel 109 coupled between outlet port 107 and enclosure 101 of cooling plate 100. Extended vapor channel 109 can be implemented as an extension to enclosure 101 that is narrower than enclosure 101, where extended vapor channel 109 can include an intermediate holding region to direct vapor from enclosure 101 to outlet port 107. For example, during operation, extended vapor channel 109 can be submerged within single-phase coolant fluid of an immersion environment. When evaporated vapor is directed (via pressure due to a change in volume within enclosure 101) through extended vapor channel 109, from enclosure 101 to outlet port 107, extended vapor channel 109 can further condense parts of the vapor back to a liquid phase, and the condensed liquid can return directly back to an inner region of enclosure 101 or cooling plate 100, via gravity as further illustrate in FIG. 2. Thus, extended vapor channel 109 can increase an overall cooling acceleration of cooling plate 100.

FIG. 2 is a block diagram illustrating an immersion server configuration 200 with local cooling acceleration according to one embodiment. Server configuration 200 can include a server housing 201 having one or more servers 202 housed within. Servers 202 can include high density chip 203. It can be seen that cooling plate 100 is coupled directly onto chip 203 as an example.

Servers 202 can be configured to provide IT services. Specifically, servers 202 may include a host server (referred to as a host node) and/or one or more compute servers (also referred to as computing nodes, such as CPU server and GPU server). The host server (having one or more CPUs) typically interfaces with clients (not shown) over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. In one embodiment, servers 202 can perform any type of computing task and/or can be any type of computing device (e.g., a server, a storage device, etc.). In one embodiment, servers 202 can be edge computing devices. Thus, while servers 202 provide the IT services, each of servers 202 generates heat that is transferred to single-phase or two-phase coolant.

Server configuration 200 can include inlet port 205 and outlet port 207. Inlet port 205 can be used to couple a system supply to supply line 215. Supply line 215 can be flexibly extended to inlet port 105 of cooling plate 100 to supply a two-phase coolant fluid to cooling plate 100. Outlet port 207 can be used to couple a system return to return line 217. Return line 217 can be flexibly extended to outlet port 107 of cooling plate to return a vapor from cooling plate 100. When in operation, cooling plate 100 can circulate a two-phase coolant fluid to high density chip 205 while the rest of server 202 can be immersed in a single-phase immersion coolant fluid. Extended vapor channel 109 of cooling plate 100 can be submerged within the single-phase immersion fluid and directs two-phase coolant fluid in vapor phase from enclosure 101 to outlet port 107. In addition, extended vapor channel 109 can cool parts of vapor to liquid phase, where two-phase fluid in liquid phase can directly return to enclosure 101 via gravity. Supply/return lines (or loops 215-217) can operate in a passive manner via gravity. For example, cool two-phase cooling fluid would enter cooling plate 100 via line 215 and would fall to a bottom portion of enclosure 101 of cooling plate 100. When the two-phase cooling fluid absorbs heat and evaporates into a vapor, the vapor tends to rise to extended vapor channel 109 of enclosure 101, where the vapor exits from ports 107 to line 217.

FIG. 3 is a block diagram illustrating an immersion configuration 300 utilizing single-phase with two-phase fluids for local cooling acceleration according to one embodiment. Immersion configuration 300 can be a server enclosure package that provides a single-phase coolant fluid immersion environment. Immersion configuration 300 can include an immersion container or immersion tank 301. As shown in FIG. 3, immersion tank 301 can include a supply unit (supply manifold) 315 and a return unit (return manifold) 317. Supply unit 315 can be a supply manifold with one or more fluid connectors 305A-B. Return unit 317 can be a supply manifold with one or more vapor connectors 307A-B. These connectors 305A-B, 307A-B can be used to mated directly to server inlet ports 205A-B and outlet ports 207A-B by extending fluid line extensions 215A-B and 217A-B, respectively.

In one embodiment, immersion tank 301 includes condensing unit 309. Condensing unit 309 can include a collector 311 package together with condensing unit 309. Condensing unit 309 be coupled to return unit 317. Vapor that travels to condensing unit 309 can be condensed back to liquid phase, where the two-phase coolant in liquid phase can be collected in collector 311. Two-phase coolant in liquid phase can then be supplied to supply unit 315 via line 319. Condensing unit 309 may be connected to an external cooling source (not shown).

As shown in FIG. 3, immersion tank 301 can be filled with a coolant fluid (single-phase coolant fluid) 303. It can be seen a server housing 201 is submerged within single-phase coolant 303. In one embodiment, server housing 201 can include a server 202 with chips that directly interface to two cooling plates 100A-B to provide two-phase thermal cooling to the chip. Cooling plates 100A-B are coupled to supply unit 315 and return unit 317 through connectors 205-207, 305-307 and extension lines 215-217, at the inlet and outlet ports (not shown) of the coolant plates 100A-B to circulate a two-phase coolant fluid 313 to coolant high density electronics of server 202.

Figure 4:
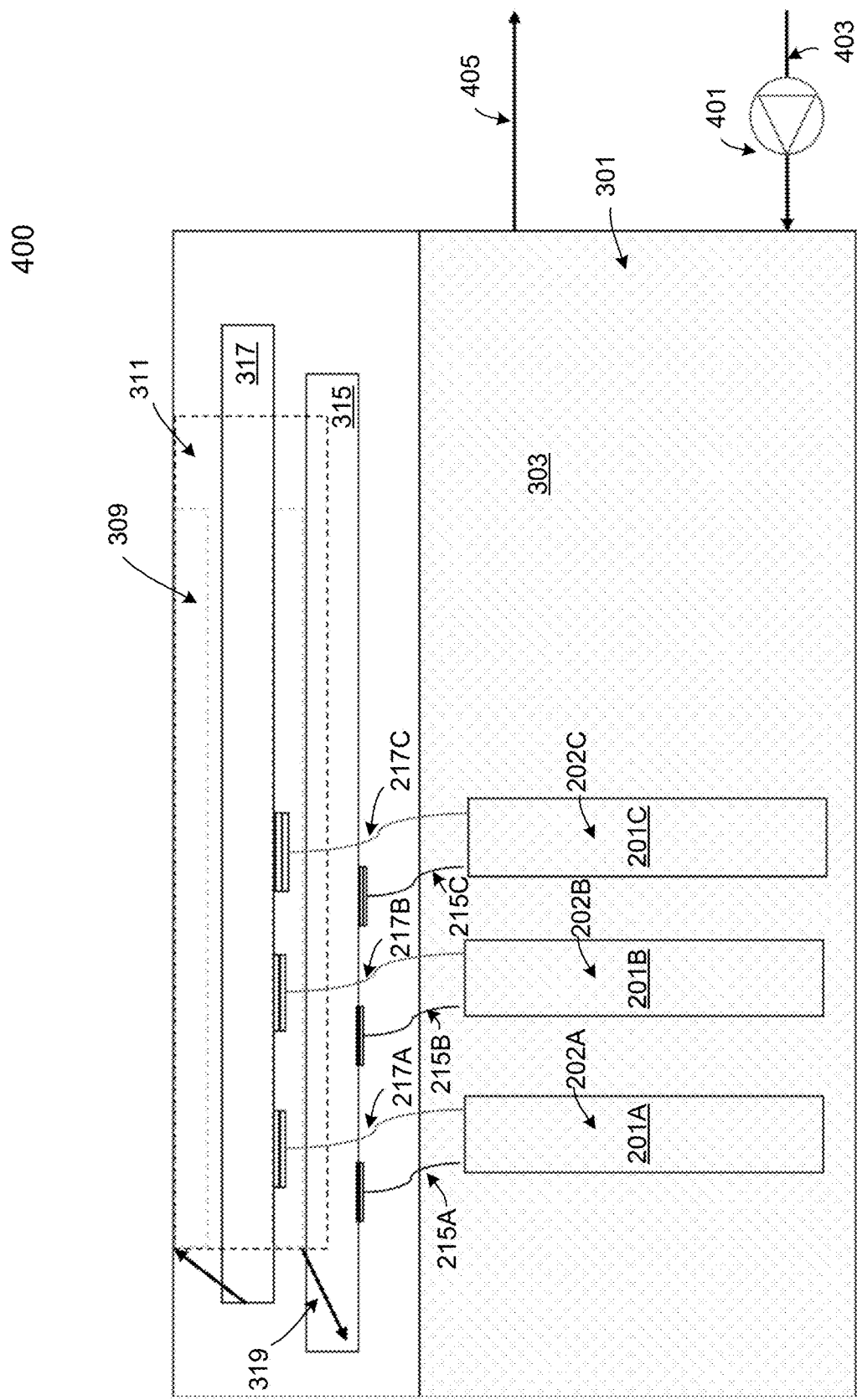
FIG. 4 is a block diagram illustrating a front view of an immersion configuration with one or more servers having local cooling acceleration according to one embodiment.

FIG. 4 is a block diagram illustrating a front view of an immersion configuration 400 with one or more servers having local cooling acceleration according to one embodiment. As shown in FIG. 4, one or more servers 202A-C are populated within server housings 201A-C. Server housings 201A-C are contained within immersion tank 301 and a single-phase coolant 303 is being operated by a pump 401 via external supply 403 and return loop 405. As shown, the single-phase loop 403/305 is a system level loop and two-phase loops are formed by the following units: supply unit 315, liquid loop 215, cooling plates 100 in the servers, vapor loop 217, return unit 317, condensing unit 309, and collector 311.

Figure 5:
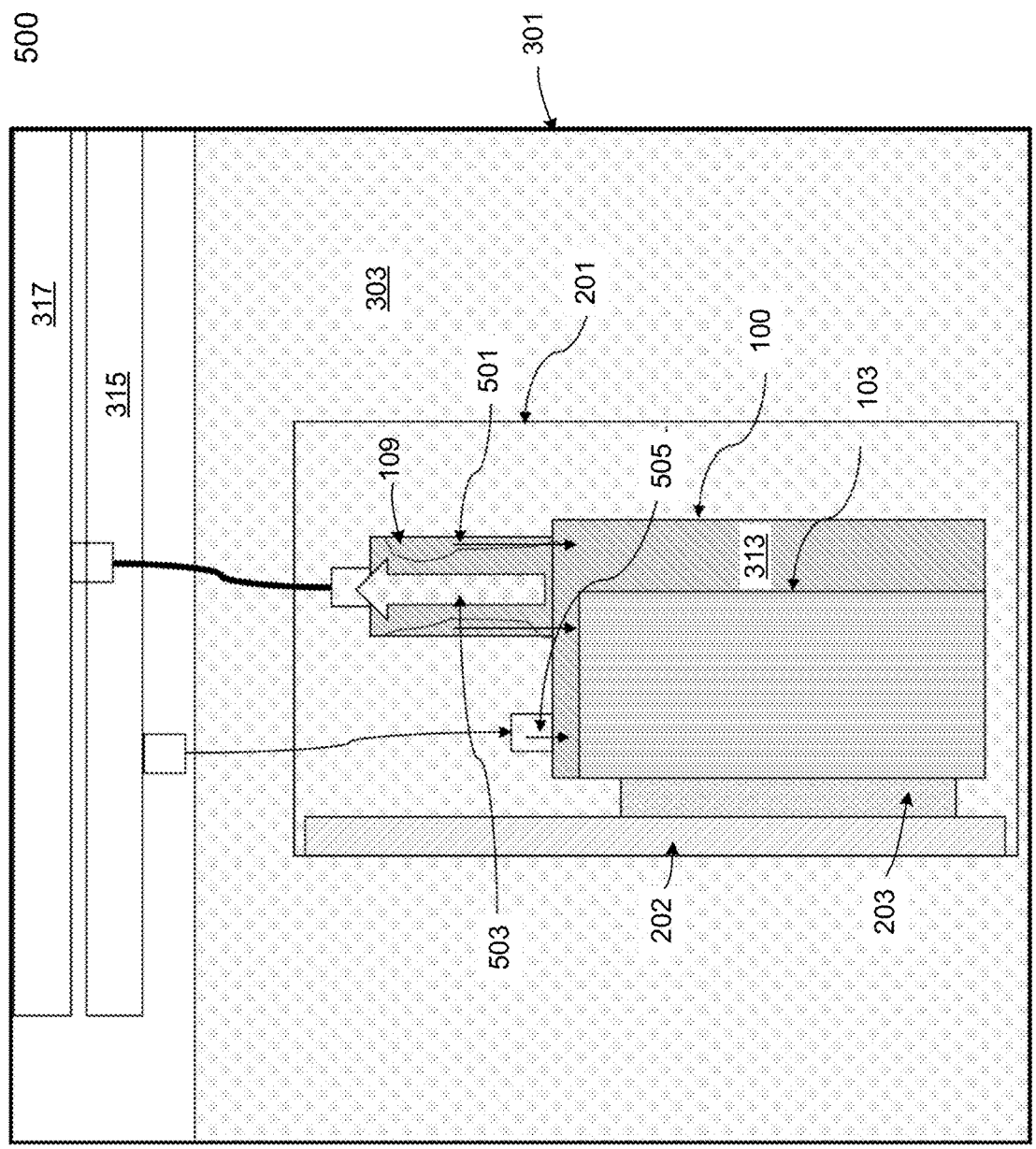
FIG. 5 is a block diagram illustrating a side view of an immersion configuration with one or more servers having local cooling acceleration according to one embodiment.

FIG. 5 is a block diagram illustrating a side view of an immersion configuration 500 with one or more servers having local cooling acceleration according to one embodiment. Immersion configuration 500 can represent immersion configuration 300. As shown in FIG. 5, configuration 500 illustrates the overall system having a mix of single-phase coolant 303 and two-phase coolant 313 contained in an immersion tank (e.g., within an immersion enclosure) 301 for electronic cooling. As shown, a server 202 is submerged in single-phase coolant 303 and cooling plate 100 is directly attached to high density chip 203, where a loop circulates two-phase coolant 313 from a condensing unit 309 (shown in FIG. 4) to cooling plate 100 to accelerate cooling for high density chip 203.

Single-phase coolant fluid 303 cools everting which are in contact with it which includes all the electronics submerged within single-phase coolant fluid 303, directly and indirectly. Cooling plate 100 is used for extracting the heat from chip 203 through the phase change of two-phase coolant 313 contained within cooling plate 100. Two-phase coolant 313 in vapor phase is being generated within cooling plate 100 by absorbing heat from high density chip 203 where vapor travels to extended vapor channel 109 and flows to return unit 317 and then condensing unit 309.

It is seen that within extended vapor channel 109, since portions of, or the entire, channel 109 is being submerged in single-phase coolant 303, channel 109 can condense portions of the vapor back to liquid phase as illustrated by liquid flow 501 (via gravity). Liquid following liquid flow 501 then directly returns back to a two-phase liquid region within cooling plate 100. A different portion of the vapor travels via flow 503 to return unit 317, then to condensing unit 309 (not shown). Vapor at condensing unit 309 is then condensed back into liquid phase and this portion of the fluid will then return to cooling plate 100 through supply unit 315 as illustrated by liquid flow 505 (via gravity).

The overall cooling system incorporates cooling plate 100 to work with both single-phase and two-phase coolants to extract heat from the chip 203. The fluid circulation path for the single-phase coolant fluid 303 are separate from the fluid circulation paths of the two-phase coolant fluid 313 but both fluids 303, 313 can function together using cooling plate 100 to extract heat from the chip 203.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling plate, comprising:
a fluid inlet port coupled to at least one inlet extensible line to receive a two-phase fluid from at least one server inlet port;
a cooling enclosure thermally coupled to server electronics for cooling acceleration;
an inlet channel coupled between the fluid inlet port and the cooling enclosure to channel the two-phase fluid entering from the fluid inlet port to the cooling enclosure, wherein the cooling enclosure is surrounded by a single-phase fluid, the cooling enclosure comprising:
a plurality of heat spreading structures coupled to an inner surface of the cooling enclosure to form a plurality of spacings between the plurality of heat spreading structures, wherein the plurality of spacings increase a surface contact area of the two-phase fluid containable within the cooling enclosure with the plurality of heat spreading structures to distribute heat from the plurality of heat spreading structures to the two-phase fluid to cause at least a portion of the two-phase fluid to change into a vapor phase;
an extended vapor channel coupled to the cooling enclosure to collect the two-phase fluid in vapor phase; and
a vapor outlet port coupled between the extended vapor channel and at least one outlet extensible line to return the two-phase fluid in vapor phase from the extended vapor channel to at least one server outlet port to exit the cooling plate.

2. The cooling plate of claim 1, wherein the spacings between the heat spreading structures form fluid channels along a longitudinal direction of the heat spreading structures.

3. The cooling plate of claim 1, wherein the cooling enclosure includes an internal region to contain the two-phase fluid and the cooling enclosure separates the single-phase fluid surrounding the cooling enclosure from the two-phase fluid contained therein when the cooling plate is submerged into the single-phase fluid.

4. The cooling plate of claim 1, wherein the fluid inlet port is connected to a two-phase liquid supply and the vapor outlet port is connected to a vapor return connectors of an immersion tank when the cooling plate is submerged into the immersion tank.

5. The cooling plate of claim 1, wherein the extended vapor channel includes an intermediate holding region for the two-phase fluid in vapor phase prior to transporting the two-phase fluid in vapor phase to the vapor outlet port.

6. The cooling plate of claim 5, wherein the extended vapor channel is submersible within the single-phase fluid to exchange heat between the single-phase fluid and the two-phase fluid in vapor phase contained within the extended vapor channel to condense at least a portion of the two-phase fluid in vapor phase back to a liquid phase, wherein the two-phase fluid in liquid phase returns directly to an internal region of the cooling enclosure.

7. The cooling plate of claim 1, wherein the cooling plate is submersible in an immersion tank containing the single-phase fluid, wherein a fluid flow of the single-phase fluid is separated from a fluid flow of the two-phase fluid within an internal region of the cooling enclosure.

8. The cooling plate of claim 1, wherein the plurality of heat spreading structures are assembled or directly molded on the cooling enclosure.

9. The cooling plate of claim 1, wherein a surface of the cooling enclosure interfaces with a chip to provide two-phase thermal cooling to the chip.

10. The cooling plate of claim 1, wherein the vapor outlet port is coupled to the extended vapor channel via a first flexible hose and the fluid inlet port is coupled to the inlet channel via a second flexible hose.

11. A server configuration, comprising:
- a server enclosure having server electronics housed within;
- at least one server inlet port;
- at least one server outlet port;
- at least one inlet extensible line coupled to the at least one server inlet port;
- at least one outlet extensible line coupled to the at least one server outlet port; and
- a cooling plate, comprising:
  - a fluid inlet port coupled to the at least one inlet extensible line to receive a two-phase fluid from the at least one server inlet port;
  - a cooling enclosure thermally coupled to portions of the server electronics for cooling acceleration;
  - an inlet channel coupled between the fluid inlet port and the cooling enclosure to channel the two-phase fluid entering from the fluid inlet port to the cooling enclosure, the cooling enclosure comprising:
    - a plurality of heat spreading structures coupled to an inner surface of the cooling enclosure to form a plurality of spacings between the plurality of heat spreading structures, wherein the plurality of spacings increase a surface contact area of the two-phase fluid containable within the cooling enclosure with the plurality of heat spreading structures to distribute heat from the plurality of heat spreading structures to the two-phase fluid to cause at least a portion of the two-phase fluid to change into a vapor phase;
    - an extended vapor channel coupled to the cooling enclosure to collect the two-phase fluid in vapor phase; and
    - a vapor outlet port coupled between the extended vapor channel and the at least one outlet extensible line to return the two-phase fluid in vapor phase from the extended vapor channel to the at least one server outlet port, wherein the cooling plate is submersible in an immersion tank containing a single-phase fluid.

12. The server configuration of claim 11, wherein the cooling enclosure includes an internal region to contain the two-phase fluid and the cooling enclosure separates the single-phase fluid surrounding the cooling enclosure from the two-phase fluid contained therein.

13. The server configuration of claim 12, wherein the extended vapor channel includes an intermediate holding region for the two-phase fluid in vapor phase prior to transporting the two-phase fluid in vapor phase to the vapor outlet port.

14. The server configuration of claim 12, wherein the extended vapor channel is submersible within the single-phase fluid to exchange heat between the single-phase fluid and the two-phase fluid in vapor phase contained within the extended vapor channel to condense at least a portion of the two-phase fluid in vapor phase to liquid phase, wherein the two-phase fluid in liquid phase returns directly to the internal region of the cooling enclosure.

15. The server configuration of claim 11, wherein the spacings between the heat spreading structures form fluid channels along a longitudinal direction of the heat spreading structures.

16. The server configuration of claim 11, wherein the fluid inlet port is connected to a two-phase liquid supply and the vapor outlet port is connected to a vapor return connectors of the immersion tank when the cooling plate is submerged into the immersion tank.

17. The server configuration of claim 11, wherein the cooling plate is submersible in the immersion tank containing the single-phase fluid, wherein a fluid flow of the single-phase fluid is separated from a fluid flow of the two-phase fluid within an internal region of the cooling enclosure.

18. The server configuration of claim 11, wherein the plurality of heat spreading structures are assembled or directly molded on the cooling enclosure.

19. The server configuration of claim 11, wherein a surface of the cooling enclosure interfaces with a chip to provide two-phase thermal cooling to the chip.

20. The server configuration of claim 11, wherein the vapor outlet port is coupled to the extended vapor channel via a first flexible hose and the fluid inlet port is coupled to the inlet channel via a second flexible hose.

* * * * *